(12) United States Patent
Jing et al.

(10) Patent No.: US 10,610,886 B2
(45) Date of Patent: Apr. 7, 2020

(54) TRANSFER ROLLER, ENCAPSULATING GLUE FILM COATING SYSTEM, AND METHOD OF ENCAPSULATING THE GLUE FILM

(71) Applicants: BOE Technology Group Co., Ltd., Beijing (CN); Hefei BOE Optoelectronics Technology Co., Ltd., Anhui (CN)

(72) Inventors: Yangkun Jing, Beijing (CN); Xing Wu, Beijing (CN)

(73) Assignees: BOE TECHNOLOGY GROUP CO., LTD., Beijing (CN); HEFEI BOE OPTOELECTRONICS TECHNOLOGY CO., LTD., Anhui (CN)

( * ) Notice: Subject to any disclaimer, the term of this patent is extended or adjusted under 35 U.S.C. 154(b) by 291 days.

(21) Appl. No.: 14/785,657

(22) PCT Filed: Mar. 31, 2015

(86) PCT No.: PCT/CN2015/075500
§ 371 (c)(1),
(2) Date: Oct. 20, 2015

(87) PCT Pub. No.: WO2016/070557
PCT Pub. Date: May 12, 2016

(65) Prior Publication Data
US 2016/0339468 A1 Nov. 24, 2016

(30) Foreign Application Priority Data
Nov. 7, 2014 (CN) .......................... 2014 1 0624528

(51) Int. Cl.
*B05D 1/28* (2006.01)
*H01L 51/52* (2006.01)

(52) U.S. Cl.
CPC ............ *B05D 1/28* (2013.01); *H01L 51/5253* (2013.01)

(58) Field of Classification Search
CPC .................................. B05D 1/28; B05C 1/025
See application file for complete search history.

(56) References Cited

U.S. PATENT DOCUMENTS

| 4,530,140 A | * | 7/1985 | Okamura ........... G03G 15/2025 |
| | | | 492/50 |
| 4,737,394 A | * | 4/1988 | Zafiroglu ................. D04H 1/52 |
| | | | 428/102 |

(Continued)

FOREIGN PATENT DOCUMENTS

| CN | 1156852 A | 8/1997 |
| CN | 1279136 A | 1/2001 |

(Continued)

OTHER PUBLICATIONS

International Search Report and Written Opinion for PCT Application No. PCT/CN2015/075500, dated Aug. 3, 2015, 9 pages.

(Continued)

*Primary Examiner* — Kelly M Gambetta
(74) *Attorney, Agent, or Firm* — Westman, Champlin & Koehler, P.A.

(57) ABSTRACT

An encapsulating glue film coating system and a transfer roller thereof, and a method of forming an encapsulating glue film are provided. The encapsulating glue film coating system comprises: a support platform configured to carry a display panel to be encapsulated; a glue liquid storage device configured to provide a glue liquid; a glue liquid input device mounted on the support platform and configured to receive the glue liquid from the glue liquid storage device; and a transfer roller configured to receive the glue liquid from the glue liquid input device. The transfer roller is configure to transfer glue liquid to a coating roller and comprises: a roller body; an absorbing layer disposed around the roller body, the absorbing layer having a plurality of micropores communicating with external environment; and a transfer layer disposed around the absorbing layer for (Continued)

transferring glue liquid to a coating roller, wherein the transfer layer is provided with a plurality of first through-holes, so as to allow impurities to enter the micropores in the absorbing layer. With the encapsulating glue film coating system, glue liquid can be uniformly applied onto the display panel.

27 Claims, 7 Drawing Sheets

(56) References Cited

U.S. PATENT DOCUMENTS

| | | | |
|---|---|---|---|
| 5,361,126 A | 11/1994 | Loonen et al. | |
| 2011/0122999 A1* | 5/2011 | Vogtmeier | B22F 3/114 |
| | | | 378/154 |

FOREIGN PATENT DOCUMENTS

| | | |
|---|---|---|
| CN | 103203304 A | 7/2013 |
| CN | 104307686 A | 1/2015 |
| CN | 204194217 U | 3/2015 |
| JP | 2005-186054 A | 7/2005 |

OTHER PUBLICATIONS

English translation of Box No. V from the Written Opinion for the International Searching Authority for PCT Application No. PCT/CN2015/075500, 2 pages.

First Office Action, including Search Report, for Chinese Patent Application No. 201410624528.6, dated Mar. 23, 2016, 7 pages.

Second Office Action, including Search Report, for Chinese Patent Application No. 201410624528.6, dated Jul. 29, 2016, 4 pages.

* cited by examiner

TRANSFER ROLLER, ENCAPSULATING GLUE FILM COATING SYSTEM, AND METHOD OF ENCAPSULATING THE GLUE FILM

CROSS-REFERENCE TO RELATED APPLICATION

This application is a Section 371 National Stage Application of International Application No. PCT/CN2015/075500, filed on 31 Mar. 2015, entitled "TRANSFER ROLLER, ENCAPSULATING GLUE FILM COATING SYSTEM, AND METHOD OF ENCAPSULATING THE GLUE FILM", which has not yet published, which claims priority to Chinese Application No. 201410624528.6, filed on Nov. 7, 2014, incorporated herein by reference in their entirety.

BACKGROUND

Technical Field

Embodiments disclosed in this disclosure relate to an encapsulating glue film coating system, more particularly to an encapsulating glue film coating system and transfer roller thereof for encapsulating a substrate of a display device, and a method for coating the glue film.

Description of the Related Art

In the field of displays, Organic Light Emitting Diodes (OLEDs), and Active Matrix Organic Light Emitting Diodes (AMOLEDs) has been widely used in flat panel displays due to their characteristics of self-luminous, high contrast, fast response, small investment for manufacturing equipment, simple process, and the like. For example, the light-emitting principle of the OLED is that several layers of organic material (including an organic light emitting material) are deposited between two electrodes, and when a DC voltage is applied between the two electrodes, the organic light emitting material is caused to emit light.

In OLED displays, organic light-emitting material will fail in case of contacting with water and oxygen, therefore the glass substrate disposed in front of the organic light-emitting material should be encapsulated with a back cover plate, so as to be isolated from water vapor and oxygen, and thereby increasing life of a display. An OLED display is usually encapsulated with a metal cover plate, a glass cover plate or a film. A Metal cover plate is different from a glass cover plate in expansion coefficient, which leads to a deformation of entire display device and high cost. At present, usually glass cover plate is used. According to production process of an OLED, a plurality of recesses having a certain area and flat bottoms are required to be etched on the glass cover, with desiccant filled in the recesses, and at the same time, high-precision alignment marks are etched so that the display and the glass substrate can be precisely aligned and fitted.

Currently, in production process of such a glass cover plate, firstly, relative thick anti-etching protective films are applied on front and rear surfaces of a flat glass for forming a substrate, then one side of the glass is exposed to formed a pattern of the recesses, then developed to remove protective films inside the pattern, then the glass is disposed into an etching liquid to form the recesses, and finally the protective film on surface of the glass is removed. In this production process, a high-precision exposure machine is needed, otherwise the alignment accuracy does not meet the requirement for encapsulating, such that the manufacturing cost is very high; in particular, the adhesion between protective film and glass is inadequate, so that the film is easy to separate from the glass, resulting in a large number of defects, so that the production cost is further increased.

Further, due to requirement for high coating speed, the requirement for uniformity of coating on a surface is high, therefore there is needed a surface coating apparatus that can provide high-speed, high-uniformity coating and can precisely control of the amount of glue. Current drip type coating may provide a high coating speed, but the uniformity of glue is low, and a plurality of nozzles are needed, so that replacement of components is extremely time-consuming.

SUMMARY

Embodiments of the disclosure provide a transfer roller, an encapsulating glue film coating system, and a method of encapsulating the glue film, which may uniformly coating a glue liquid on a display panel.

According to one aspect of this disclosure, there is provided a transfer roller, comprising: a roller body; an absorbing layer disposed around the roller body; and a transfer layer disposed around the absorbing layer for transferring a glue liquid to a coating roller. The absorbing layer is provided with a plurality of micropores therein, the transfer layer is provided with a plurality of first through-holes therein, and the micropores communicate with outside of the transfer roller via the first through-holes.

According to an exemplary embodiment of the transfer roller, the absorbing layer comprises: a storage layer disposed around the roller body; and a wrapping layer disposed around the storage layer to secure the storage layer, wherein the micropores are formed in the storage layer, the wrapping layer is provided with a plurality of second through-holes therein, and the micropores communicate with the first through-holes via the second through-holes.

According to another exemplary embodiment of the transfer roller, each micropore has a size that gradually increases in a radially outward direction.

According to another exemplary embodiment of the transfer roller, absorbing particulates are provided in each micropore.

According to another exemplary embodiment of the transfer roller, the sizes of the absorbing particulates in the micropores gradually increase from inside toward outside in a radially outward direction.

According to another aspect of this disclosure, there is provided an encapsulating glue film coating system for coating a glue liquid on a display panel, and the encapsulating glue film coating system comprises: a glue liquid storage device configured to provide the glue liquid; a glue liquid input device configured to receive the glue liquid outputted from the glue liquid storage device; a transfer roller according to any one of the above embodiments, configured to receive the glue liquid from the glue liquid input device; and a coating roller configured to receive the glue liquid from the transfer roller and coat the received glue liquid onto the display panel.

According to an exemplary embodiment of the encapsulating glue film coating system, the encapsulating glue film coating system further comprises a scraping plate disposed outside of and adjacent to the transfer roller for scraping off impurity substances or residual glue liquid adhered on the transfer roller.

According to another exemplary embodiment of the encapsulating glue film coating system, the glue liquid input device comprises a plurality of glue liquid input units disposed side by side, and each glue liquid input unit comprises: a storage compartment configured to store the glue liquid from the glue liquid storage device; a nozzle communicating with the storage compartment for supplying the glue liquid to the transfer roller; and a drive device configured to drive the glue liquid inside the storage compartment to the nozzle.

According to another exemplary embodiment of the encapsulating glue film coating system, the drive device comprises: a cylinder communicating with the storage compartment for providing a pressurized gas into the storage compartment; a gas tube communicating with the cylinder for transmitting a gas from an external gas source to the cylinder; and a control valve disposed in the gas tube for controlling a pressure inside the cylinder.

According to another exemplary embodiment of the encapsulating glue film coating system, the drive device further comprises: a piston disposed in the storage compartment and moved by the gas from the gas tube so as to push the glue liquid to flow out of the nozzle.

According to another exemplary embodiment of the encapsulating glue film coating system, the encapsulating glue film coating system further comprises a control system including: a detecting device configured to detect a distribution of the glue liquid that has already been applied on the display panel; and a controller configured to control the drive device based on the detected distribution of the glue liquid, so as to adjust the amount of the glue liquid discharged from the nozzle.

According to another exemplary embodiment of the encapsulating glue film coating system, the detecting device comprises at least one image pick-up device, and the distribution of glue liquid comprises any one of thickness and plane sizes of the glue liquid, continuous distribution status, and whether or not air bubbles being contained, and the distribution of the air bubbles.

According to another exemplary embodiment of the encapsulating glue film coating system, the detecting device is further configured to detect a pressure applied by the coating roller.

According to another exemplary embodiment of the encapsulating glue film coating system, the control system further comprises an image processing device for processing an image signal from the image pick-up device to obtain the distribution of the glue liquid, and the image processing device is configured to filter out a noise signal from the image signal.

According to another exemplary embodiment of the encapsulating glue film coating system, a surface of the coating roller is covered by a coating layer made of a piezoelectric material, and the coating layer is configured to control the amount of glue liquid transferred to the display panel.

According to another exemplary embodiment of the encapsulating glue film coating system, the controller is further configured to control the coating layer to generate a deformation matching with a pattern to be formed in a corresponding region of the display panel.

According to another exemplary embodiment of the encapsulating glue film coating system, when the corresponding region of the display panel has a protrusion, the controller is configured to control the coating layer to generate a concave deformation at a position corresponding to the position of the protrusion; and when the corresponding region of the display panel has a recess, the controller is configured to control the coating layer to generate a convex deformation at a position corresponding to the position of the recess.

According to a further aspect of this disclosure, there is provided a method of coating an encapsulating glue film on a display panel using the encapsulating glue film coating system according to any one of the above, the method comprises steps of:

supplying the glue liquid from the glue liquid storage device to the glue liquid input device;

applying the glue liquid to a surface of the transfer roller by the glue liquid input device;

transferring the glue liquid to the coating roller by the transfer roller; and coating the glue liquid onto the display panel by the coating roller.

According to an exemplary embodiment of the method, the step of applying the glue liquid to the surface of the transfer roller by the glue liquid input device comprises: detecting a distribution of the glue liquid applied on the display panel; and adjusting an amount of the glue liquid discharged from a nozzle of the glue liquid input device based on the detected distribution of the glue liquid.

According to another exemplary embodiment of the method, the distribution of glue liquid comprises any one of thickness and plane sizes of the glue liquid, continuous distribution status, and whether or not air bubbles being contained, and the distribution of the air bubbles.

According to another exemplary embodiment of the method, the step of detecting the distribution of the glue liquid applied on the display panel comprises: obtaining an image signal about the distribution of the applied glue liquid by an image pick-up device; and processing the image signal from the image pick-up device to obtain information of the distribution by an image processing device, wherein processing the image signal comprises filtering out a noise signal from the image signal.

According to another exemplary embodiment of the method, the glue liquid applied on an edge region of the display panel has a different physical property from that of the glue liquid applied on a main region of the display panel inside the edge region, such that sealability of the glue film formed within the edge region is higher than that of the glue film formed within the main region.

According to another exemplary embodiment of the method, the physical property comprises at least one of concentration, thickness, and viscosity of the glue liquid.

According to another exemplary embodiment of the method, the glue liquid discharged from at least one glue liquid input unit located at two side regions of the transfer roller has a different physical property from that of the glue liquid discharged from a plurality of glue liquid input units located at a central region of the transfer roller between the two side regions.

According to another exemplary embodiment of the method, a glue liquid discharging operation of the glue liquid input units at the two side regions of the transfer roller is performed after a glue liquid discharging operation of the glue liquid input units at the central region of the transfer roller between the two side regions.

According to another exemplary embodiment of the method, a glue liquid discharging operation of the glue liquid input units located at the two side regions of the transfer roller and a glue liquid discharging operation of the glue liquid input units located at the central region of the transfer roller between the two side regions are performed at the same time.

According to another exemplary embodiment of the method, the step of applying the glue liquid to a surface of the transfer roller by the glue liquid input device comprises:

sucking a droplet of the glue liquid emerged from a nozzle of the glue liquid input unit back into the nozzle after a glue liquid discharging operation of each glue liquid input unit of the glue liquid storage device has been completed.

BRIEF DESCRIPTION OF THE DRAWINGS

To make the purpose, technical solutions, and advantages of the present invention apparent, a detailed description of the present invention is provided in conjunction with detailed embodiments and the following drawings, in which.

DETAILED DESCRIPTION OF PREFERRED EMBODIMENTS

Figure 1:
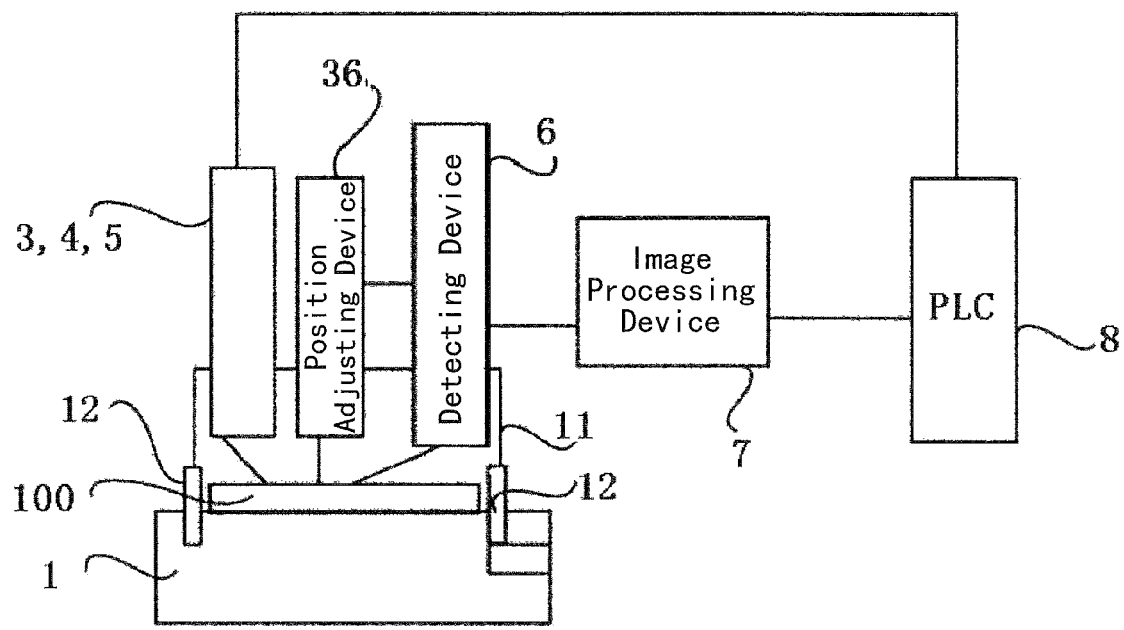
FIG. 1 is a block diagram showing the principle of the encapsulating glue film coating system according to a first exemplary embodiment of the present invention.

Technical solutions of the present invention will be further described in detail in the following embodiments in conjunction with the accompanying drawings. In the description, the same or similar reference numerals indicate the same or similar parts. The following description to the embodiments of the present invention is intended to set forth the general inventive concept of the present invention, and should not be construed as a limitation of the present invention.

According a general concept of this disclosure, there is provided an encapsulating glue film coating system, which comprises: a support platform configured to carry a display panel to be encapsulated; a glue liquid storage device configured to provide a glue liquid; a glue liquid input device mounted on the support platform and connecting with the glue liquid storage device for receiving glue liquid from the glue liquid storage device; and a transfer roller configured to receive the glue liquid from the glue liquid input device. The transfer roller is configure to transfer glue liquid to a coating roller and comprises: a roller body; an absorbing layer disposed around the roller body, the absorbing layer having a plurality of micropores communicating with external environment; and a transfer layer disposed around the absorbing layer for transferring glue liquid to the coating roller, wherein the transfer layer is provided with a plurality of first through-holes, so as to allow impurities to enter the micropores in the absorbing layer.

In the following detailed description, for purposes of explanation, numerous specific details are set forth to provide a thorough understanding of the embodiments of the present disclosure. Obviously, however, one or more embodiments can be implemented without these specific details. In other instances, well-known structures and devices are shown in a simplified manner so as to simplify the drawings.

Figure 2:
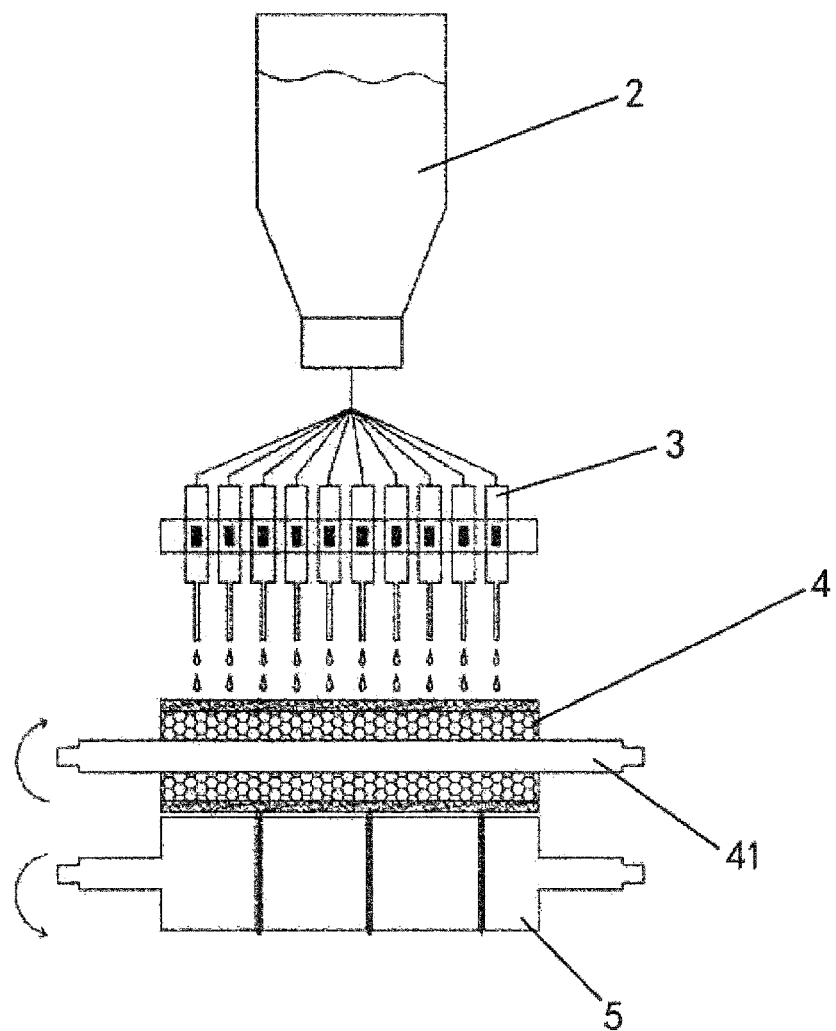
FIG. 2 is a side view showing the principle of the encapsulating glue film coating system according to the first exemplary embodiment of the present invention, in which a supporting platform is not shown.
Figure 3:
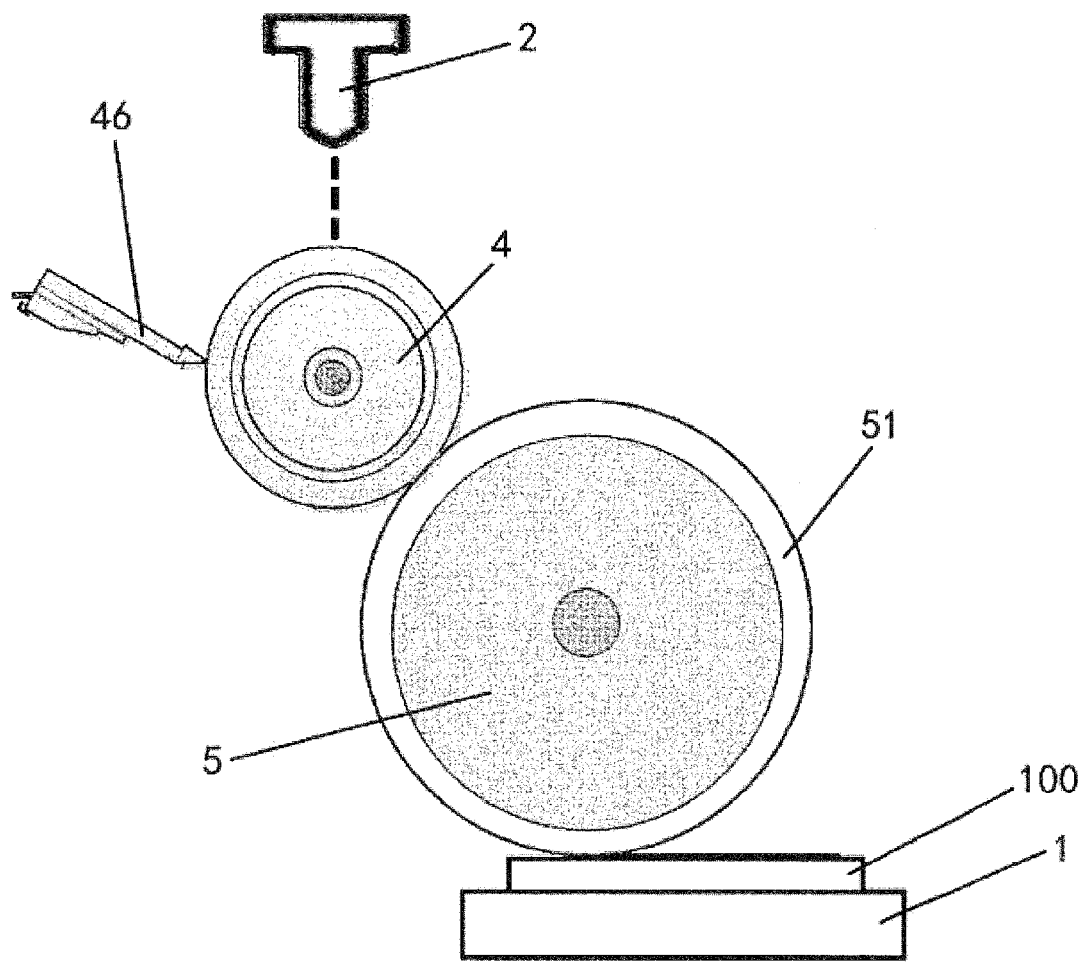
FIG. 3 is another side view showing the principle of the encapsulating glue film coating system according to the first exemplary embodiment of the present invention, in which the supporting platform is shown.

FIG. 1 is a block diagram showing the principle of the encapsulating glue film coating system according to a first exemplary embodiment of the present invention; FIG. 2 is a side view showing the principle of the encapsulating glue film coating system according to the first exemplary embodiment of the present invention, in which a supporting platform is not shown; and FIG. 3 is another side view showing the principle of the encapsulating glue film coating system according to the first exemplary embodiment of the present invention, in which the supporting platform is shown. The encapsulating glue film coating system according to the first exemplary embodiment of the present invention is used for encapsulating the display panel with a glue film, for example, the display panel may be a display panel based on Organic Light Emitting Diode (OLED) or Active Matrix Organic Light Emitting Diode (AMOLED), and comprises an array substrate and a touch substrate that are assembled together. Through encapsulating the substrates of the display panel from outside with an encapsulating glue film, foreign substance such as water, water vapor, and oxygen are prevented from entering the inside of the display panel, such that light-emitting material inside of the display panel is physically isolated from outside, and thereby performance of the light-emitting material can be maintained stable for a long time and the life of the display panel is extended.

Refer to FIGS. 1-3, an encapsulating glue film coating system according to an exemplary embodiment comprises: a supporting platform 1, a glue liquid storage device 2, a glue liquid input device 3, a transfer roller 4 and a coating roller 5. The supporting platform 1 is configured to support and secure a display panel 100 to be encapsulated; the glue liquid storage device 2 is configured to provide glue liquid; the glue liquid input device 3 is connected, for example through a gas tube, to the glue liquid storage device 2 for receiving glue liquid provided by the glue liquid storage device 2; the transfer roller 4 is configured to receive glue liquid from the glue liquid input device the transfer roller 4 transfers the glue liquid uniformly to the coating roller 5, and the coating roller 5 applies the glue liquid onto the display panel 100. After the glue liquid applied on the display panel solidifies, an encapsulating glue film is formed, and the encapsulating glue film can prevent foreign substance such as water, water vapor, oxygen or dust particles from entering the inside of the display panel, such that light-emitting material inside the display panel is physically isolated from external environment. Each of the glue liquid storage device 2, the glue liquid input device 3, the transfer roller 4 and the coating roller 5 may mounted on or fixed to a support or frame 11.

Figure 4:
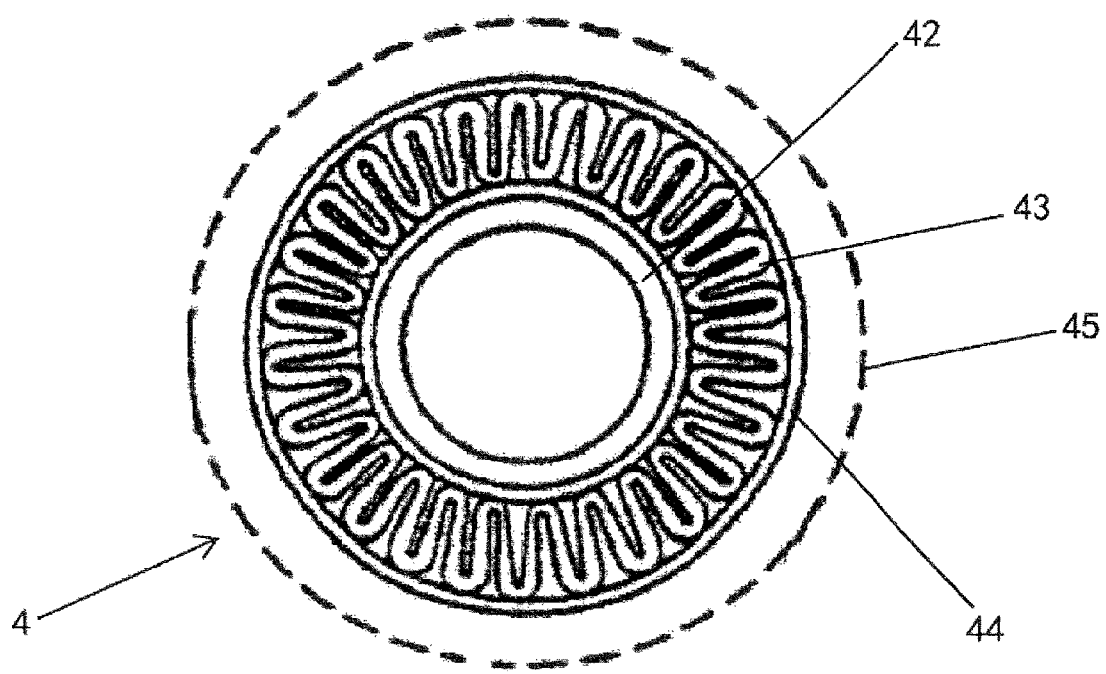
FIG. 4 is a side view in an axial direction of a transfer roller according to one exemplary embodiment of the present invention.

As shown in FIGS. 3 and 4, the transfer roller 4 is configured to transfer glue liquid to the coating roller 5, and the transfer roller 4 comprises: a roller body 42 mounted on a rotation shaft 41, an absorbing layer and a transfer layer 45, wherein the absorbing layer is disposed around the roller body, and the absorbing layer is provided with a plurality of micropores that communicate with external environment.

The transfer layer 45 is disposed around the absorbing layer for transferring glue liquid to the coating roller 5. The transfer layer 45 is provided with a plurality of first through-holes, so as to allow impurities in the glue liquid to enter the micropores in the absorbing layer. For example, the transfer layer 45 is formed of a flexible material having tiny pores, so that the transfer layer can closely contact an encapsulating layer 44 to control the amount of glue liquid applied on the coating roller 5. In such a manner, impurities in glue liquid may be absorbed by the absorbing layer, so that glue liquid transferred to the coating roller 5 can be uniformly applied on the coating roller. Moreover, the absorbing layer may also absorb excessive glue liquid on the transfer roller.

In one exemplary embodiment, the absorbing layer comprises a storage layer 43 and the encapsulating layer 44, wherein the storage layer 43 is disposed around the roller body 42, and the micropores are formed in the storage layer for storing impurities and/or excessive glue liquid. The encapsulating layer 44 is disposed around the storage layer 43 for holding the storage layer 43. The encapsulating layer 44 is provided with a plurality of second through-holes for allowing impurities to enter the micropores. The micropores are filled with absorbing particulates to improve its absorbing ability to impurity particulates. In the exemplary embodiment, the first through-holes and the second through-holes are configured respectively as numerous micropores in the transfer layer 45 and in the encapsulating layer 44.

With the transfer roller 4 and the encapsulating glue film coating system comprising such a transfer roller, since the transfer roller 4 is comprised of an absorbing layer and a transfer layer having a plurality of through-holes, excessive glue liquid and impurities in glue liquid may pass through through-holes of the transfer layer into the micropores of the absorbing layer, so that an uniform distribution of the glue liquid on the surface of the transfer layer can be achieved. For example, the storage layer 43 of the absorbing layer may be formed of any one of polyurethane, polytetrafluoroethylene, and carbon nano-tube material, and be formed into a foam structure. While the transfer roller 4 is rotating relative to the coating roller 5 transferring the glue liquid on the transfer roller 4 onto the coating roller 5, the storage layer 43 of the absorbing layer can absorb impurities in the glue liquid and excessive glue liquid via the first through-holes of the transfer layer and the second through-holes of the encapsulating layer 44, and the impurities will be absorbed by the absorbing particulates within the micropores.

In one exemplary embodiment, the micropores in the storage layer 43 become larger in a radial direction from an inner side towards an outer side; and the sizes of the absorbing particulates within the micropores become larger in the radial direction from the inner side towards the outer side. In such a manner, concentration of the impurities towards the inner side along the radial direction is facilitated, so that more impurities can be accommodated.

In one exemplary embodiment, a scraping plate 46 is mounted outside of and adjacent to the transfer layer 45 of the transfer roller 4. The transfer roller 4 rotates relative to the scraping plate 46 and scraps off impurities having not entered the inside of the transfer roller 4 or residual glue liquid from the transfer roller 4. In such a manner, the transfer roller can be further efficiently cleaned, so as to ensure that the glue liquid can be uniformly applied on the coating roller 5 in a following transfer process, and that coating material wrapped around the surface of the coating roller can be efficiently protected, and as a result, service life of the coating material can be extended, and the coating material may not be replaced so frequently.

For example, the glue liquid storage device 2 is disposed on the support, and a digital display system may be further provided to expressly indicate an input amount of glue liquid when a process is started, so that the amount can be timely adjusted based on the condition of the process. During the process of the coating roller 5 coating glue liquid onto the display panel 100, the coating roller 5 rotates relative to the display panel 100, and the display panel 100 moves relative to the coating roller 5. For example, the coating roller 5 moves in a lift-right direction to cooperate with the rotation of the coating roller 5, such that glue liquid can be uniformly applied onto the surface of the display panel 100 by the coating roller 5.

In one embodiment, as shown in FIG. 1, the glue liquid input device 3, the transfer roller 4, and the coating roller 5 are all mounted on the support 11, and the support 11 is mounted on a supporting platform 1 through a guiding rail 12 in such a manner that the support 11 is movable relative to the support platform 1. A position adjusting device 36 is also provided on the support 11 for locating the positions of the glue liquid input device 3, the transfer roller 4 and the coating roller 5, or relative positions therebetween. The position adjusting device 36 comprises a plurality of motors associated with the glue liquid input device 3, the transfer roller 4 and the coating roller 5, respectively. Through operating the associated motors, the glue liquid input device 3, the transfer roller 4 and the coating roller 5 may move along a transverse direction (i.e., an axial direction of the coating roller 5) or a longitudinal direction relative to the supporting platform. In an alternative embodiment, the supporting platform 1 is configured to be movable along a guiding rail, and the support 11 is configured to be fixed relative to the support platform 1.

As shown in FIGS. 1-3 and 5, in an exemplary embodiment, the glue liquid input device 3 comprises a plurality of glue liquid input units disposed side by side, and each glue liquid input unit comprises a storage compartment 31, a nozzle 32 and a drive device. The storage compartment 31 is configured to store the glue liquid from the glue liquid storage device; the nozzle 32 communicates with the storage compartment 31 for supplying glue liquid to the transfer roller 4; and the drive device is configured to drive the glue liquid inside the storage compartment 31 to the nozzle 32. As shown in FIG. 2, the plurality of nozzles is arrange in a row and along an approximate axial direction of the transfer roller 4, so as to supply glue liquid substantially uniformly, such that the glue liquid is applied to the transfer roller. Since the glue liquid has a certain viscosity and openings of the nozzles 32 are small, the drive device may exert a pressure to the glue liquid within the storage compartment 31 to drive the glue liquid out from the nozzles 32.

In one embodiment, the drive device comprises a cylinder 33, a gas tube 34 and a control valve 35. The cylinder 33 communicates with the storage compartment 31 for providing a pressurized gas into the storage compartment 31; the gas tube 34 communicates with the cylinder 33 for transmitting gas from an external gas source (not shown) to the cylinder 33, so that the pressurized gas is applied into the storage compartment 31; and the control valve 35 is disposed in the gas tube 34 for control the pressure inside the cylinder 33. Furthermore, each glue liquid input unit also comprises a corresponding position adjusting device 36 mounted on the support 11. The position adjusting device 36, for example, comprises a motor, to adjust the position of the corresponding glue liquid input unit relative to the supporting platform, for example, to adjust the height of the glue liquid input unit, additionally, the transfer roller 4 and the coating roller 5 may also be provided with a respective position adjusting device to cooperate with the position adjusting device 36 of the glue liquid input unit, such that relative positions between the transfer roller 4, the coating roller 5 and each glue liquid input unit can be adjusted.

Further, the drive device also comprises a piston (not shown) disposed in the storage compartment 31 and moved by gas from the gas tube 34, to push glue liquid out from the nozzle 32. In the case that the gas directly contacts the glue liquid, an improved respond speed can be provided. However, due to the viscosity of the glue liquid, the glue liquid tends to adhere to the side wall of the storage compartment 31, so that the glue liquid in a central region can be moved easily. As a result, the glue liquid cannot be supplied from the nozzles uniformly. When a piston is provided, the piston contacts and pushes the glue liquid, so that the glue liquid is uniformly pushed and supplied from the nozzles. However, such a configuration decreases the respond speed, so that when the pressure of the gas varies, a hysteresis phenomenon occurs.

In the above embodiments, through using a pressurized gas, such as nitrogen, as a driving medium to drive glue liquid out from the nozzles 32, the whole structure of the glue liquid input device can be simplified. In an alternative embodiment, a piezoelectric actuator may be used to drive the glue liquid; moreover, a piston or a cam driven by a motor may also be used to drive the glue liquid. The drive device may be selected according to practical situations, which is not restriction to this disclosure.

Figure 5:
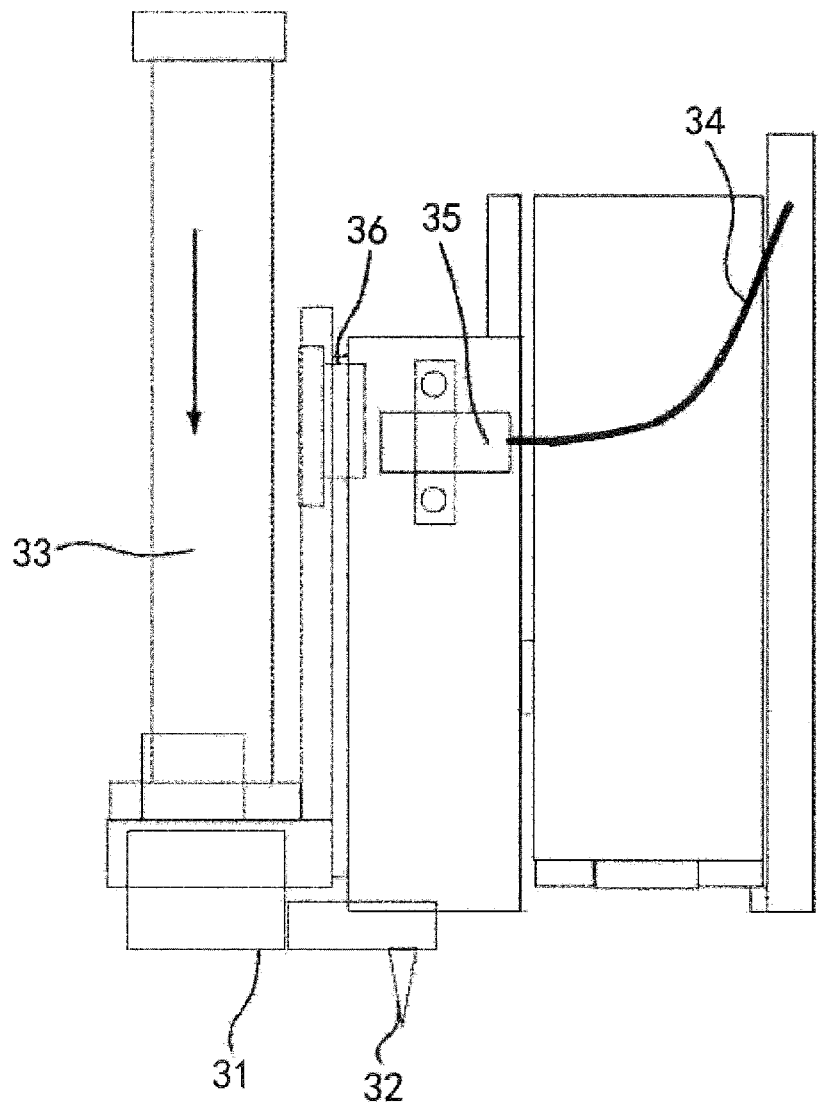
FIG. 5 is a schematic view showing the operating principle of a glue input unit according to one exemplary embodiment of the present invention.
Figure 6:
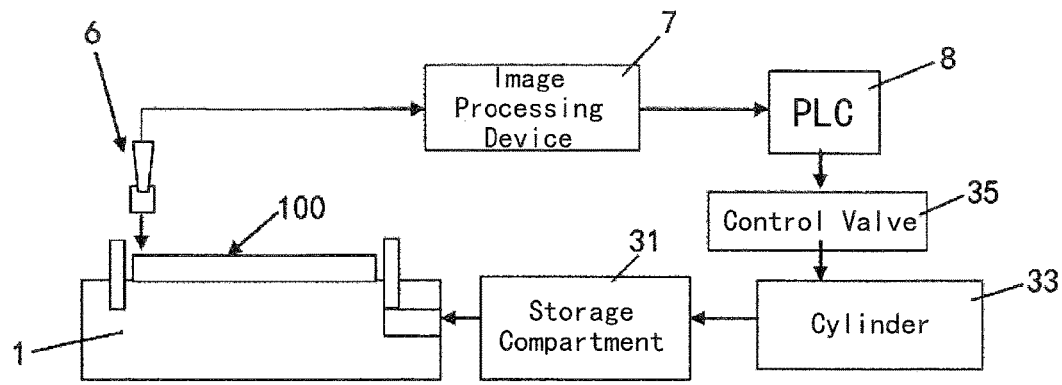
FIG. 6 is a block diagram showing the control principle of the encapsulating glue film coating system according to the first exemplary embodiment of the present invention.

Please refer to FIGS. 1 and 6, the encapsulating glue film coating system according the exemplary embodiment further comprises a control system, which comprises: a detecting device; and a controller, wherein the detecting device is configured to detect a distribution of glue liquid that has already been applied on the display panel 100; for example, a controller such as a programmable logic controller (PLC) 8 is configured to control the drive device based on the detected distribution of the glue liquid, so as to adjust the amount of glue liquid discharged from the nozzles 32. The amount of glue liquid discharged and the timing of injection may be controlled through the controller, for example, the glue liquid may be discharged from the nozzles 32 in a one-drop-filling mode, and the amount of glue liquid discharged from each nozzle can be separately controlled, and a spacing between two adjacent nozzles may be adjusted through the position adjusting devices 36 (FIG. 5). In such a way, defects such as bubbles, coating failure and build-up of liquid droplets can be avoided, and as a result, glue liquid can be uniformly applied on the display panel, thereby improving the performance of the coating.

As shown in FIG. 6, in one exemplary embodiment, the detecting device comprises at least one image pick-up device 6, for example, three infrared image pick-up devices. Position relations among the three image pick-up devices 6 and position relations between each image pick-up device and the support platform can be adjusted according to practical requirements. The distribution of glue liquid comprises any one of thickness and plane sizes of the glue liquid, continuous distribution status, whether air bubbles are included, and the distribution of the air bubbles. Further, a pressure applied by the coating roller 5 may also be detected by the detecting device. For example, the coating pressure may be determined based on a distance between the coating roller 5 and the display panel on the support platform 1 obtained by the image pick-up device 6.

The control system further comprises an image processing device 7 for processing an image signal from the image pick-up device 6 to obtain the distribution of the glue liquid. For example, the image processing device 7 is configured to filter out noise signals from the image signal.

When picking up an image with the image pick-up device, the obtained image may include noise interference. The noise interference degrades quality of the image, blurs the image, and masks features of the image, so that processing the image become difficult. Noises in an image are generated mainly due to environmental disturbances and human factors during image acquiring and transmission. During processing of an image, the acquiring process is influenced by various noises, so that some isolated pixels appear in the image. These pixels are significantly different from adjacent pixels and interfere with the performance of image acquiring. If no filtering is adopted, these pixels will badly affect image segmentation, image analysis, and image processing that follow. For example, a linear filter can efficiently eliminate the noise interference during image acquiring.

In one exemplary embodiment, an image processing algorithm based on high efficiency median filtering is adopted to eliminate noises in the image, to efficiently suppress noises, and to filter out impulse interference and image scanning noise, and in the meantime, blurs in details of image caused by the linear filter can be avoided, and edge information is retained.

The median in the image processing is defined as follows: a set of numbers $X_1, X_2, X_3, \ldots, (X_1 \leq X_2 \leq X_3 \ldots \leq X_n)$ are arranged in order of their values as follows:

$$y = \text{med}\{X_1, X_2, X_3, \ldots, X_n\} = \begin{cases} X_{(\frac{n+1}{2})}, & \ldots n \text{ is an odd number} \\ \frac{1}{2}\left[X_{\frac{n}{2}} + X_{(\frac{n}{2}+1)}\right], & \ldots n \text{ is an even number} \end{cases}$$

Wherein y is the median of the set of numbers $X_1, X_2, X_3, \ldots, X_n$.

Using median filtering to process an image to filter out noises comprises the following steps: setting a size of a filter module, for example, a 5×5 module; roaming the module in the image, aligning the center of the module with a certain pixel; obtaining grey values of the pixels under the module; arranging these grey values from the smallest to the largest; taking the middle one as a median value; assigning the median value to the pixel at the center of the module. In such a way, difference value among adjacent pixels tends to zero, so that the isolated noise pixel is eliminated.

A software IMAQ Vision can be used to perform the median filtering process on a color image, and a method is as follows: abstracting red, green, and blue three color palettes from an original 32-bit image; using a 32-bit integer to indicate the color image RGB in the IMAQ Vision; median filtering the red, green, and blue three color palettes (8-bit) in the RGB, attenuating random noises while ensuring sharp edges, so as to retain size characteristics. A bitwise operation is performed on the processed RGB color palettes, such that the original image is converted to a new color image with noises having been eliminated.

To obtain an image of a certain location on the display panel 100, an illumination device may be provided. The illumination device, for example, may have a LED being used as a light source, which has good color rendering property, high intensity, low power consumption, low heat dissipation, wide spectrum range, and high endurance.

After image signal is processed, the distribution of glue liquid on the display panel is obtained. If defects, such as non-uniform thickness and air bubbles, exist, the programmable logic controller 8 may send a corresponding control instruction to the control valve 35 to vary the opening of the control valve 35, for example, increase or decrease the amount of pressurized gas from the gas source (not shown), or increases or decrease the pressure inside the cylinder 33, so as to control the amount of glue liquid discharged from the nozzles 32. When a piston is provided in the storage compartment, when the pressure inside the cylinder 33 is changed, the position of the piston is changed, and thereby glue liquid are pushed by the piston out from the nozzles.

Figure 9:
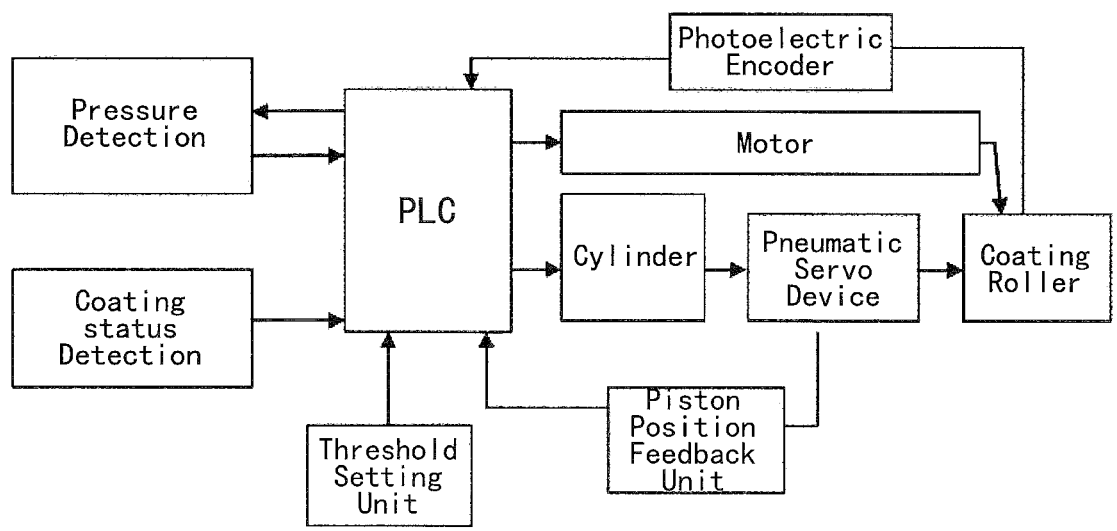
FIG. 9 is a block diagram showing how the amount of glue discharge is controlled with a control system according to one exemplary embodiment of the present invention.

As shown in FIG. 9, the detecting device has a function of detecting the distribution of glue liquid and the coating pressure exerted by the coating roller, that is to say, the detecting device may perform pressure detecting and coating condition detecting. The process of control the amount of glue liquid discharged by the nozzles has been described above in conjunction with FIG. 9. In embodiments, the pressure applied by the coating roller may also be controlled. For example, the detecting device detects the pressure applied by the coating roller on the display panel, if the pressure is too high, the thickness of applied glue liquid will be too thin, and if the pressure is too low, the thickness of the applied glue liquid will be too thick. In either condition of the above, the performance of coating will be adversely affected. For example, when the thickness detected by the detecting device is too thick, the programmable logic controller will send an instruction to a motor of a position adjusting device, and the position adjusting device lowers the coating roller relative to the display panel, such that the pressure applied by the coating roller on the display panel is increased, and thereby the thickness is decreased.

Further, as shown in FIG. 9, the control system further comprises a photoelectric encoder for detecting the position of the coating roller 5. The control system further comprises a piston position feedback unit for providing position of the piston to the controller. In this circumstance, the piston actuated by gas is used as a pneumatic servo device and may move inside the storage compartment. The control system also comprises a threshold setting unit for setting the upper threshold for various objects being detected, such as the thickness and plane size of the glue liquid, continuous distribution status, whether air bubbles are included, the distribution of the air bubbles, and coating pressure. When the object being detected has gone beyond a preset threshold, the controller correspondingly controls parameters, such as amount of discharged glue liquid or the height of the coating rollers, based on the type of the object.

In the encapsulating glue film coating system according to the embodiment, as shown in FIGS. 1 and 3, the surface of the coating roller 5 is covered by a coating layer 51 formed of a piezoelectric material. The coating layer 51 is configured to control the amount of glue liquid transferred to the display panel 100. In such a way, glue liquid may be uniformly applied on the display panel 100. The coating layer 51 is configured to be able to generate a convex-concave pattern. A controller such as the PLC 8 may control the convex-concave pattern such that the pattern matches with a pattern to be formed on a corresponding region of the display panel.

In one exemplary embodiment, the controller may control a state (for example, convex-concave state) of the coating layer 51 formed of piezoelectric material. For example, when a region of the display panel 100 has a protrusion, the controller controls the coating layer 51 to generate a concave deformation at a position corresponding to the position of the protrusion of the display panel 100; and when a region of the display panel 100 has a recess, the controller controls the coating layer 51 to generate a convex deformation at a position corresponding to the position of the recess of the display panel 100. In such a way, according to the convex-concave shape of the display panel 100, a corresponding convex-concave shape is formed on the coating layer 51 for coating glue liquid, and thereby uniformity of applied glue liquid is improved.

The encapsulating glue film coating system according to the embodiment may control the coating layer formed of piezoelectric material to generate or cancel a convex-concave pattern corresponding to a region of each display region based on the position of the region of the display panel to be applied. For example, different parameters of the coating layer formed of piezoelectric material may be set by a controller, so that different convex-concave patterns can be generated to correspond to the surface structure of the display penal or a display substrate, thereby the uniformity of coating can be improved. In such a way, the transfer roller may adapt to different types of display substrates to be applied. For example, for different types of display substrates to be applied, through setting different parameters of the coating layer formed of piezoelectric material, different kinds of convex-concave patterns can be achieved for coating the glue liquid.

According to a further embodiment, as shown in FIGS. 1-6 and 9, there is provided a method of coating an encapsulating glue film on a display panel 100 using the encapsulating glue film coating system according to any one of the above embodiments. The method may comprises steps of: mounting the display panel 100 on the supporting platform 1; supplying glue liquid from the glue liquid storage device 2 to the glue liquid input device 3; applying the glue liquid to the surface of the transfer roller 4 uniformly by the glue liquid input device 3, the absorbing layer of the transferring roll 4 being able to absorb glue liquid and impurities in the glue liquid and the micropore interconnected inside the absorbing layer making the distribution of glue liquid even more uniform; transferring the glue liquid to the coating roller 5 through the rotation of the transfer roller 4 relative to the coating roller 5, the absorbing layer being also able to absorbing the impurities adhered to the coating roller 5; and coating the glue liquid onto the display panel 100 through a relative movement of the coating roller 5 with respect to the display panel 100.

In the method of coating an encapsulating glue film on display panel 100 according to the embodiment, the absorbing layer 43 of the transfer roller 4 can evenly absorb glue liquid from the glue liquid input device 3, so that an uniform glue liquid coating may be achieved. While the transfer roller 4 rotates relative to the coating roller 5 to transfer the glue liquid onto the coating roller 5 uniformly from the transfer roller 4, the absorbing layer 43 can absorb residual glue liquid on the surface of the coating roller 5 or other impurities adhered to the surface of the coating roller, the impurities enter the micropores and are absorbed by the absorbing particulates. In such a way, the coating roller can be effectively cleaned to ensure the glue liquid being uniformly applied on the display panel when a next coating operation is performed, and to effectively protect the coating material on the surface of the coating roller and to extend the life of the coating material, thereby the coating material will not be replaced so frequently.

In one exemplary embodiment, the step of applying glue liquid to the surface of the transfer roller 4 by the glue liquid input device 3 comprises steps of: detecting a distribution of applied glue liquid on the display panel 100; and adjusting an amount of glue liquid discharged from a nozzle 32 of the glue liquid input device 3 based on the detected distribution of the glue liquid. For example, the distribution of glue liquid comprises any one of thickness and plane sizes of the glue liquid, continuous distribution status, and whether air bubbles are included, and the distribution of the air bubbles. In such a way, defects such as bubbles, coating failure and build-up of liquid droplets can be avoided, and as a result, glue liquid can be uniformly applied on the display panel, thereby improving the performance of the coating.

In one exemplary embodiment, the step of detecting the distribution of the applied glue liquid on the display panel 100 comprises steps of: obtaining an image signal about the distribution of the applied glue liquid on the display panel 100 by an image pick-up device 6; and processing the image signal from the image pick-up device 6 and obtaining information of the distribution by an image processing device 7, and filtering out a noise signal from the image signal during processing the image signal, such that adverse effect on the result of the detection can be avoided and thereby improving the accuracy of the result.

Figure 8:
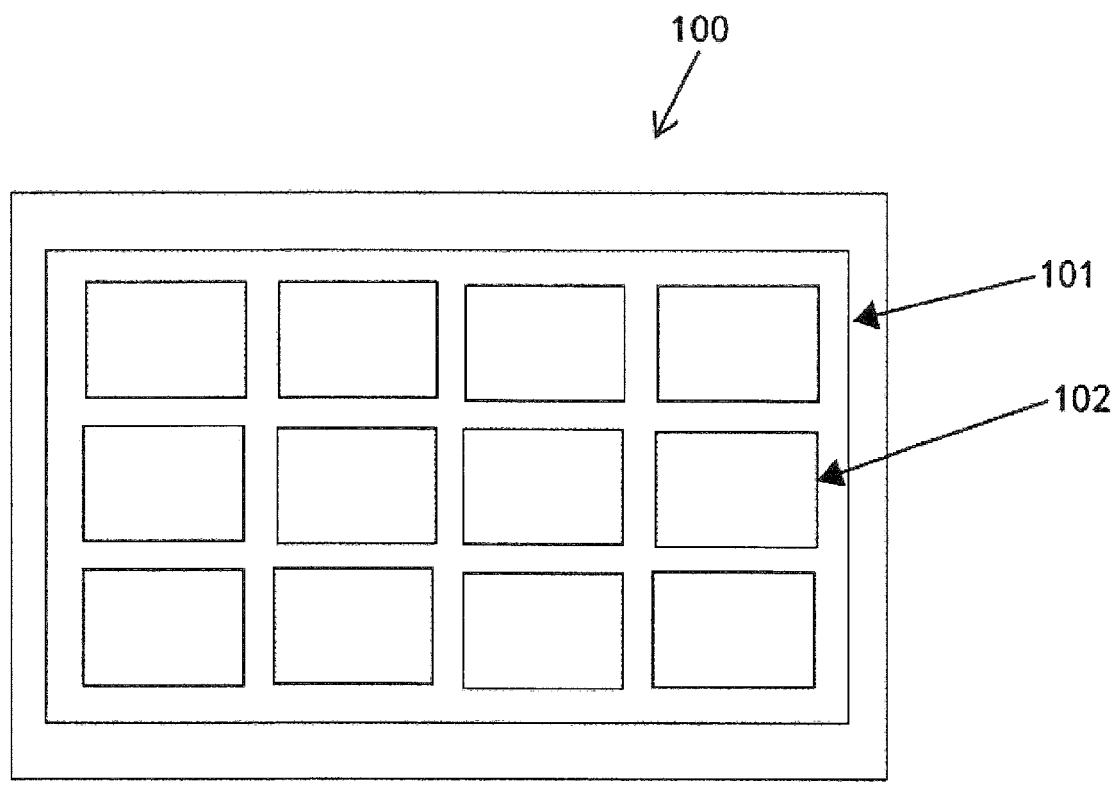
FIG. 8 is a schematic view showing a manner in which the encapsulating glue film is disposed on a display substrate according to one exemplary embodiment of the present invention.

In one embodiment, as shown in FIGS. 2 and 8, in the step of coating the glue liquid onto the display panel 100, the glue liquid applied on an edge region 101 of the display panel 100 has a different physical property from that of the glue liquid applied on a main region 102 of the display panel 100 inside the edge region, such that sealability of the glue film formed at the edge region 101 is higher than that of the glue film formed at the main region 102. For example, the physical property comprises at least one of concentration, thickness, and viscosity of the glue liquid. Glue liquid at the edge region 101 and glue liquid at the main region 102 may be the same, or not the same. Since the edge region is related to a position at which, for example, a color filter substrate and an array substrate are bonded together, and the position will receive more impacts than the central main region 102, the glue film at the edge region 101 should have a higher sealability than the glue film at the main region 102, so as to decrease a possibility of the edge region being damaged and thereby the sealability at the edge region is improved. For example, such a configuration may be obtained through separately setting operating parameters of each glue liquid input unit. The parameters of the glue liquid input unit for supplying glue liquid to the edge region of the transfer roller 4 are set to be different from those of the glue liquid input unit for supplying glue liquid to the central region of the transfer roller 4. In another exemplary embodiment, a different type of glue liquid is supplied to the glue liquid input unit for supplying glue liquid to the edge region of the transfer roller 4. In another exemplary embodiment, the coating layer 51 of the coating roller 5 made of piezoelectric material may be controlled to provides a layer of glue liquid on the display panel 100 having different thicknesses, for example, the glue liquid in the edge region has a larger thickness.

In one exemplary embodiment, during the step of applying the glue liquid to the surface of the transfer roller 4 uniformly by the glue liquid input device 3, the glue liquid discharged from at least one glue liquid input unit located at two side regions of the transfer roller has a different physical property from that of the glue liquid discharged from a plurality of glue liquid input units located at a central region of the transfer roller inside of the side regions, such that the glue liquid applied on the edge region 101 of the display panel 100 has a different physical property from that of the glue liquid applied on the main region 102 located inside the edge region. In one embodiment, the glue liquid input device 3 is configured to be movable on the support 11 along a transverse direction (i.e., an axial direction of the coating roller), and a glue liquid discharging operation of the glue liquid input units located at the side regions of the transfer roller is performed after a glue liquid discharging operation of the glue liquid input units located at the central region of the transfer roller inside of the side regions. In an alternative embodiment, when a whole width of a plurality of glue liquid input units arranged in a row is substantially equal to the width of the display panel 100, the at least one glue liquid input unit located at two side regions of the transfer roller and the plurality of glue liquid input units located at a central region of the transfer roller inside of the side regions discharge glue liquid at the same time.

In one exemplary embodiment, the step of applying the glue liquid to the surface of the transfer roller 4 uniformly by the glue liquid input device 3 comprises a step of: sucking a droplet of glue liquid emerged from a nozzle 32 of the glue liquid input unit back into the nozzle after a glue liquid discharging operation of each glue liquid input unit of the glue liquid input device 3 has been completed. In such a manner, when a coating operation is completed, droplets of glue liquid are sucked back into the nozzle 32 without dropping to the display panel 100, such that there will be no undesired droplet on the display panel 100, and a solidification of the droplet hanging from the nozzle 32 can be avoided.

Figure 7:
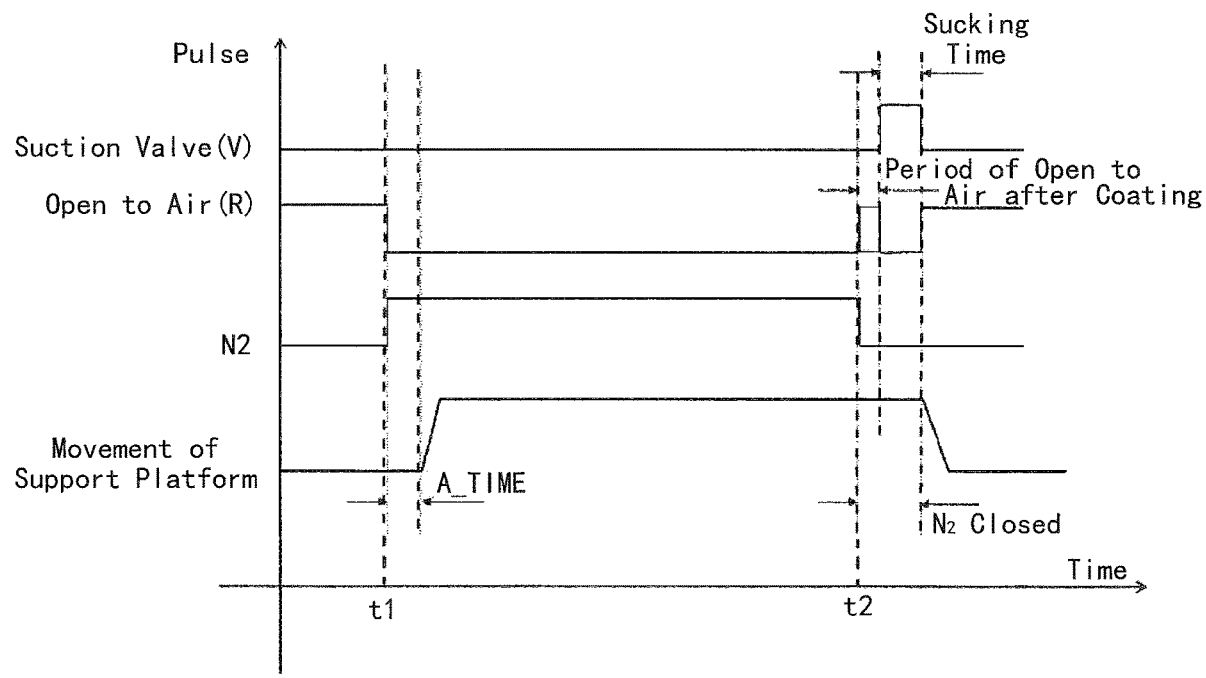
FIG. 7 is a time chart showing the pulses during a coating stage according to one exemplary embodiment of the present invention.

FIG. 7 is a time chart showing the pulses during a coating stage according to one exemplary embodiment of the present invention. As shown in FIGS. 1-3, 5 and 7, a coating operation is initiated at time t1, and at this time, the cylinder 33 is closed to external air; a pressurized gas, for example, nitrogen gas, is supplied into the cylinder through the gas tube 34, and the glue liquid inside the storage compartment 31 is discharged to the transfer roller 4 through the nozzle 32 due to the pressure, and then the glue liquid is transferred to the coating roller; after a predetermined period A_TIME, the support 1 moves relative to the coating roller 5, and the coating operation is performed. If the coating operation needs to be stopped at time t2, the nitrogen gas supplied through the gas tube 34 is stopped; the cylinder 33 is opened to the external air, and the pressure inside the cylinder 33 is substantially balanced with the external air; a suction valve is operated to provide a negative pressure inside the cylinder 33 with respect to the external air, such that the droplets emerged from the nozzles 32 are sucked back into the nozzle; then the support stops moving.

With the encapsulating glue film coating system, the transfer roller thereof, and the method of encapsulating the glue film according to the above embodiments, while the transfer roller rotates relative to the coating roller to transfer the glue liquid onto the coating roller uniformly from the transfer roller, the absorbing layer can absorb residual glue liquid on the surface of the coating roller or other impurities adhered to the surface of the coating roller. In such a way, the coating roller can be effectively cleaned to ensure the glue liquid being uniformly applied on the display panel when a next coating operation is performed, and to effectively protect the coating material on the surface of the coating roller and to extend the life of the coating material, thereby the coating material will not be replaced so frequently. Moreover, the coating roller moves synchronously with the display panel, residual glue liquid on the surface of the display panel can be cleaned, and glue liquid can be evenly absorbed so that amount of glue liquid being applied can be simply and explicitly adjusted, such that an non-uniform glue liquid applied for forming the encapsulating glue film due to excessive glue liquid can be avoided, and also residual glue liquid that cannot be easily cleaned may also be eliminated.

The objects, technical solutions and beneficial technical effects of this disclosure have been described in detail in conjunction with the above embodiments. It is to be understand that, the above embodiments are just specific ways of implementing the concept of this disclosure, and do not intend to limit the scope of this disclosure. All the modifications, alternatives and improvements within the spirit and concept of this disclosure should fall within the scope of this disclosure.

What is claimed is:

1. A transfer roller, comprising:
   a roller body;
   an absorbing layer disposed around the roller body; and
   a transfer layer disposed around the absorbing layer for transferring a glue liquid to a coating roller, the transfer layer forming an outmost surface of the transfer roller, wherein the absorbing layer comprises:
   a storage layer disposed around the roller body; and
   a wrapping layer disposed around the storage layer to secure the storage layer,
   the storage layer is provided with a plurality of micropores therein, the transfer layer is provided with a plurality of first through-holes therein, the wrapping layer is provided with a plurality of second through-holes therein, and the micropores communicate with the first through-holes via the second through-holes; and
   wherein the micropores in the storage layer are connected with one another to form a sinusoidal pattern.

2. The transfer roller according to claim 1, wherein each micropore has a size that gradually increases in a radially outward direction of the transfer roller.

3. The transfer roller according to claim 1, wherein absorbing particulates are provided in each micropore.

4. The transfer roller according to claim 3, wherein the sizes of the absorbing particulates in the micropores gradually increase from inside toward outside in a radially outward direction.

5. An encapsulating glue film coating system for coating a glue liquid on a display panel, comprising:
   a glue liquid storage device configured to provide the glue liquid;
   a glue liquid input device configured to receive the glue liquid outputted from the glue liquid storage device;
   a transfer roller configured to receive the glue liquid from the glue liquid input device; and
   a coating roller configured to receive the glue liquid from the transfer roller and coat the received glue liquid onto the display panel,
   wherein the transfer roller comprises a roller body, an absorbing layer disposed around the roller body, and a transfer layer disposed around the absorbing layer for transferring a glue liquid to a coating roller, the transfer layer forming an outmost surface of the transfer roller;
   wherein the absorbing layer comprises a storage layer disposed around the roller body, and a wrapping layer disposed around the storage layer to secure the storage layer,
   the storage layer is provided with a plurality of micropores therein, the transfer layer is provided with a plurality of first through-holes therein, the wrapping layer is provided with a plurality of second through-holes therein, and the micropores communicate with the first through-holes via the second through-holes; and
   wherein the micropores in the storage layer are connected with one another to form a sinusoidal pattern.

6. The encapsulating glue film coating system according to claim 5, further comprising a scraping plate disposed outside of and adjacent to the transfer roller for scraping off impurity substances or residual glue liquid adhered on the transfer roller.

7. The encapsulating glue film coating system according to claim 5, wherein the glue liquid input device comprises a plurality of glue liquid input units disposed side by side, and each glue liquid input unit comprises:
   a storage compartment configured to store the glue liquid from the glue liquid storage device;
   a nozzle communicating with the storage compartment for supplying the glue liquid to the transfer roller; and
   a drive device configured to drive the glue liquid inside the storage compartment to the nozzle.

8. The encapsulating glue film coating system according to claim 7, wherein the drive device comprises:
   a cylinder communicating with the storage compartment for providing a pressurized gas into the storage compartment;
   a gas tube communicating with the cylinder for transmitting a gas from an external gas source to the cylinder; and
   a control valve disposed in the gas tube for controlling a pressure inside the cylinder.

9. The encapsulating glue film coating system according to claim 7, wherein the drive device further comprises:
   a piston disposed in the storage compartment and moved by the gas from the gas tube so as to push the glue liquid to flow out of the nozzle.

10. The encapsulating glue film coating system according to claim 7, further comprising a control system including:
    a detecting device configured to detect a distribution of the glue liquid that has already been applied on the display panel; and
    a controller configured to control the drive device based on the detected distribution of the glue liquid, so as to adjust the amount of the glue liquid discharged from the nozzle.

11. The encapsulating glue film coating system according to claim 10, wherein the detecting device comprises at least one image pick-up device, and the distribution of glue liquid comprises any one of thickness and plane sizes of the glue liquid, continuous distribution status, and whether or not air bubbles being contained, and the distribution of the air bubbles.

12. The encapsulating glue film coating system according to claim 11, wherein the detecting device is further configured to detect a pressure applied by the coating roller.

13. The encapsulating glue film coating system according to claim 11, wherein the control system further comprises an image processing device for processing an image signal from the image pick-up device to obtain the distribution of the glue liquid, and
    the image processing device is configured to filter out a noise signal from the image signal.

14. The encapsulating glue film coating system according to claim 10, wherein a surface of the coating roller is covered by a coating layer made of a piezoelectric material, and the coating layer is configured to control the amount of glue liquid transferred to the display panel.

15. The encapsulating glue film coating system according to claim 14, wherein the controller is further configured to control the coating layer to generate a deformation matching with a pattern to be formed in a corresponding region of the display panel.

16. The encapsulating glue film coating system according to claim 15, wherein when the corresponding region of the display panel has a protrusion, the controller is configured to control the coating layer to generate a concave deformation at a position corresponding to the position of the protrusion; and when the corresponding region of the display panel has a recess, the controller is configured to control the coating layer to generate a convex deformation at a position corresponding to the position of the recess.

17. A method of coating an encapsulating glue film on a display panel using the encapsulating glue film coating system according to claim 5, comprising steps of:
   supplying the glue liquid from the glue liquid storage device to the glue liquid input device;
   applying the glue liquid to a surface of the transfer roller by the glue liquid input device;
   transferring the glue liquid to the coating roller by the transfer roller, and
   coating the glue liquid onto the display panel by the coating roller.

18. The method according to claim 17, wherein the step of applying the glue liquid to the surface of the transfer roller by the glue liquid input device comprises:
   detecting a distribution of the glue liquid applied on the display panel; and
   adjusting an amount of the glue liquid discharged from a nozzle of the glue liquid input device based on the detected distribution of the glue liquid.

19. The method according to claim 18, wherein the distribution of glue liquid comprises any one of thickness and plane sizes of the glue liquid, continuous distribution status, and whether or not air bubbles being contained, and the distribution of the air bubbles.

20. The method according to claim 18, wherein the step of detecting the distribution of the glue liquid applied on the display panel comprises:
   obtaining an image signal about the distribution of the applied glue liquid by an image pick-up device; and
   processing the image signal from the image pick-up device to obtain information of the distribution by an image processing device,
   wherein processing the image signal comprises filtering out a noise signal from the image signal.

21. The method according to claim 17, the glue liquid applied on an edge region of the display panel has a different physical property from that of the glue liquid applied on a main region of the display panel inside the edge region, such that sealability of the glue film formed within the edge region is higher than that of the glue film formed within the main region.

22. The method according to claim 21, wherein the physical property comprises at least one of concentration, thickness, and viscosity of the glue liquid.

23. The method according to claim 21, wherein the glue liquid discharged from at least one glue liquid input unit located at two side regions of the transfer roller has a different physical property from that of the glue liquid discharged from a plurality of glue liquid input units located at a central region of the transfer roller between the two side regions.

24. The method according to claim 23, wherein a glue liquid discharging operation of the glue liquid input units at the two side regions of the transfer roller is performed after a glue liquid discharging operation of the glue liquid input units at the central region of the transfer roller between the two side regions.

25. The method according to claim 23, wherein a glue liquid discharging operation of the glue liquid input units located at the two side regions of the transfer roller and a glue liquid discharging operation of the glue liquid input units located at the central region of the transfer roller between the two side regions are performed at the same time.

26. The method according to claim 23, wherein the step of applying the glue liquid to a surface of the transfer roller by the glue liquid input device comprises:
   sucking a droplet of the glue liquid emerged from a nozzle of the glue liquid input unit back into the nozzle after a glue liquid discharging operation of each glue liquid input unit of the glue liquid storage device has been completed.

27. The encapsulating glue film coating system according to claim 7, further comprising a suction valve configured to suck a droplet of the glue liquid emerged from a nozzle of the glue liquid input unit back into the nozzle after a glue liquid discharging operating of the glue liquid input unit of the glue liquid storage device has been completed.

* * * * *